(12) United States Patent
Watanabe

(10) Patent No.: US 11,476,110 B2
(45) Date of Patent: Oct. 18, 2022

(54) SEMICONDUCTOR DEVICE

(71) Applicant: SUMITOMO ELECTRIC DEVICE INNOVATIONS, INC., Kanagawa (JP)

(72) Inventor: Kenichi Watanabe, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 17/154,416

(22) Filed: Jan. 21, 2021

(65) Prior Publication Data

US 2021/0143002 A1 May 13, 2021

Related U.S. Application Data

(63) Continuation of application No. 16/433,883, filed on Jun. 6, 2019, now Pat. No. 11,011,370.

(30) Foreign Application Priority Data

Jun. 7, 2018 (JP) .............................. JP2018-109653

(51) Int. Cl.
| | | |
|---|---|---|
| H01L 29/45 | (2006.01) | |
| H01L 21/02 | (2006.01) | |
| H01L 29/778 | (2006.01) | |
| H01L 29/66 | (2006.01) | |
| H01L 21/033 | (2006.01) | |
| H01L 21/768 | (2006.01) | |

(52) U.S. Cl.
CPC ...... *H01L 21/0217* (2013.01); *H01L 21/0228* (2013.01); *H01L 21/0337* (2013.01); *H01L 21/76846* (2013.01); *H01L 29/45* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| | | |
|---|---|---|
| 6,699,738 B2 | 3/2004 | Hwang et al. |
| 6,916,720 B2 | 7/2005 | Kiziloglu et al. |
| | (Continued) | |

FOREIGN PATENT DOCUMENTS

| | | |
|---|---|---|
| JP | 4-162531 | 6/1992 |
| JP | 2014-89992 | 5/2014 |
| TW | 486740 | 5/2002 |

*Primary Examiner* — Bradley Smith
(74) *Attorney, Agent, or Firm* — Smith, Gambrell & Russell, LLP.

(57) ABSTRACT

A semiconductor device is made by: forming an ohmic electrode including Al on a semiconductor substrate; forming a SiN film covering the ohmic electrode; forming a first photoresist on the SiN film, the first photoresist having an opening pattern overlapping the ohmic electrode; performing ultraviolet curing of the first photoresist; forming an opening in the SiN film exposed through the opening pattern and causing a surface of the ohmic electrode to be exposed inside the opening; forming a barrier metal layer on the first photoresist and on the ohmic electrode exposed through the opening; forming a second photoresist in the opening pattern; performing a heat treatment on the second photoresist and covering the barrier metal layer overlapping the opening with the second photoresist; and etching the barrier metal layer using the second photoresist.

4 Claims, 5 Drawing Sheets

(56) References Cited

U.S. PATENT DOCUMENTS

| | | |
|---|---|---|
| 8,907,350 B2 | 12/2014 | Mieczkowski |
| 9,640,429 B2 | 5/2017 | Nishi |
| 11,011,370 B2 * | 5/2021 | Watanabe ........... H01L 21/0337 |
| 2019/0259843 A1 * | 8/2019 | Sugawara ......... H01L 21/28587 |

* cited by examiner

SEMICONDUCTOR DEVICE

CROSS REFERENCE TO RELATED APPLICATIONS

This application is a continuation of U.S. application Ser. No. 16/433,883 filed on Jun. 6, 2019 which claims the priority benefit of Japanese Application No. JP2018-109653 filed on Jun. 7, 2018, the entire content of which is incorporated herein by reference.

TECHNICAL FIELD

The present disclosure relates to a method for manufacturing a semiconductor device.

BACKGROUND

From the viewpoint of conductivity and the like, there are cases in which aluminum (Al) is used for a wiring and an ohmic electrode of a semiconductor device. For example, Japanese Unexamined Patent Publication No. H4-162531 discloses a configuration in which a first layer constituted of an alloy film having an Al film or Al as a main component is provided on a surface of a diffusion layer in a semiconductor substrate.

A wiring and an ohmic electrode including Al tend to generate a hillock when a semiconductor device is manufactured. For example, when there is a gap between a barrier metal film on an ohmic electrode including Al and an insulating film covering the film, the foregoing hillock may be generated in the gap. Generation of such a hillock may cause a short circuit of a wiring or an electrode, which is not desirable.

SUMMARY

According to an aspect of the present disclosure, there is provided a method for manufacturing a semiconductor device including: forming an ohmic electrode including Al on a semiconductor substrate; forming a SiN film covering the ohmic electrode; forming a first photoresist on the SiN film, the first photoresist having an opening pattern overlapping the ohmic electrode; performing ultraviolet curing of the first photoresist; forming an opening in the SiN film exposed through the opening pattern and causing a surface of the ohmic electrode to be exposed inside the opening; forming a barrier metal layer on the first photoresist and on the ohmic electrode exposed through the opening; forming a second photoresist in the opening pattern; performing a heat treatment on the second photoresist and covering the barrier metal layer overlapping the opening with the second photoresist; and etching the barrier metal layer using the second photoresist.

According to an another aspect of the present disclosure, there is provided a method for manufacturing a semiconductor device including: forming a semiconductor stack on a semiconductor substrate; forming an ohmic electrode including Al on the semiconductor stack; forming a SiN film covering the ohmic electrode; forming a first photoresist on the SiN film, the first photoresist having an opening pattern overlapping the ohmic electrode; performing a first heat treatment on the first photoresist at a first temperature; performing ultraviolet curing of the first photoresist; forming an opening in the SiN film so as to cause a surface of the ohmic electrode to be exposed inside the opening, the opening overlapping the opening pattern; forming a barrier metal layer on the first photoresist and on the ohmic electrode exposed through the opening; forming a second photoresist in the opening pattern; performing a second heat treatment on the second photoresist at a second temperature to cover a part of the barrier metal layer with the second photoresist, the part of the barrier metal layer overlapping the opening; and etching the barrier metal layer using the second photoresist, wherein the second temperature is higher than the first temperature.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Description of Embodiment of Present Disclosure

First, details of an embodiment of the present disclosure will be enumerated and described.

The embodiment of the present disclosure is a method for manufacturing a semiconductor device including: forming an ohmic electrode including Al on a semiconductor substrate; forming a SiN film covering the ohmic electrode; forming a first photoresist on the SiN film, the first photoresist having an opening pattern overlapping the ohmic electrode; performing ultraviolet curing of the first photoresist; forming an opening in the SiN film exposed through the opening pattern and causing a surface of the ohmic electrode to be exposed inside the opening; forming a barrier metal layer on the first photoresist and on the ohmic electrode exposed through the opening; forming a second photoresist in the opening pattern; performing a heat treatment on the second photoresist and covering the barrier metal layer overlapping the opening with the second photoresist; and etching the barrier metal layer using the second photoresist.

The manufacturing method may further include performing a heat treatment on the first photoresist before the performing ultraviolet curing of the first photoresist.

The barrier metal layer may include a Ti layer, a TiWN layer, and a TiW layer which are layered in order.

A thickness of the SiN film may be within a range of 30 nm to 50 nm.

The second photoresist may be an ultraviolet resist. The heat treatment with respect to the second photoresist may be performed at 140° C. or higher.

Detailed Embodiment of Present Disclosure

Specific examples of the method for manufacturing a semiconductor device according to the embodiment of the present disclosure will be described below with reference to the drawings. The present disclosure is not limited to these examples. The present disclosure is indicated by the claims and is intended to include all of changes within meanings and a scope equivalent to the claims. In the following description, the same reference signs are applied to the same elements in description of the drawings, and duplicated description will be omitted.

Figure 1:
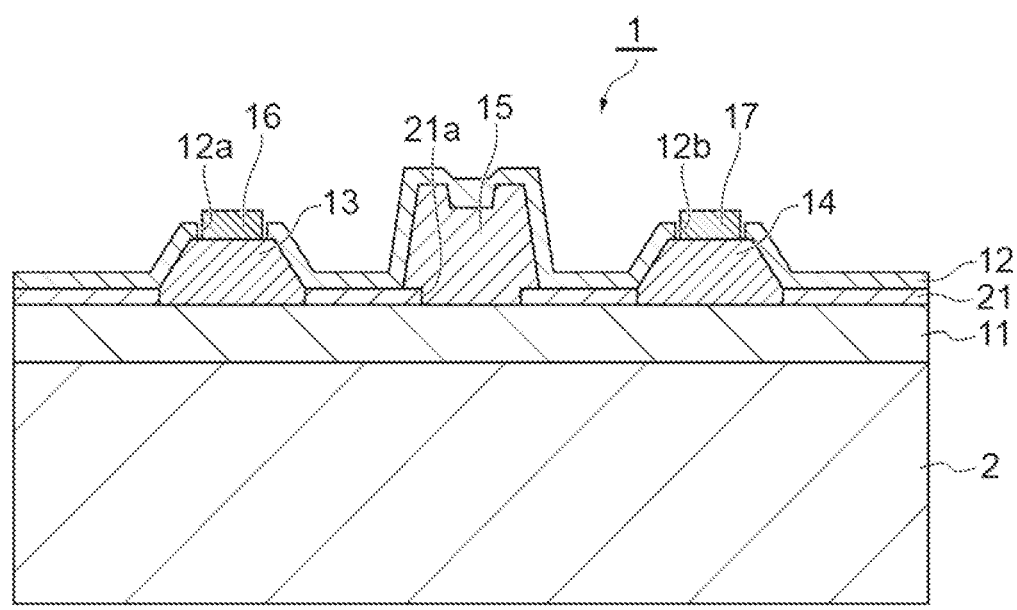
FIG. 1 is a cross-sectional view illustrating an example of a semiconductor device manufactured by a manufacturing method according to an embodiment.

FIG. 1 is a cross-sectional view illustrating a semiconductor device manufactured by the manufacturing method according to the embodiment. As illustrated in FIG. 1, for example, a semiconductor device 1 is a field effect transistor provided on a substrate 2. The substrate 2 is a substrate for crystal growth. Examples of the substrate 2 include semiconductor substrates such as a SiC substrate and a GaN substrate, or a sapphire ($Al_2O_3$) substrate. In the present embodiment, the substrate 2 is a semiconductor substrate.

The semiconductor device 1 includes a semiconductor stack 11, insulating films 12 and 21, a source electrode 13, a drain electrode 14, a gate electrode 15, and conductive barrier layers 16 and 17.

The semiconductor stack 11 is a laminate of a semiconductor layer subjected to epitaxial growth on the substrate 2. The semiconductor stack 11 includes a buffer layer, a channel layer, and a barrier layer, in order from a surface of the substrate 2, for example. The semiconductor device 1 of the present embodiment is a high electron mobility transistor (HEMT). A channel region is formed within the channel layer due to two-dimensional electron gas (2D EG) generated on the channel layer side of a boundary surface between the channel layer and the barrier layer. The buffer layer is an AlN layer, for example. The channel layer is a GaN layer, for example. The barrier layer is an AlGaN layer, for example. The semiconductor stack 11 may have a cap layer positioned on the barrier layer. The cap layer is a GaN layer, for example.

The insulating film 21 is a passivation film protecting a surface of the semiconductor stack 11 and is provided on the semiconductor stack 11. The insulating film 12 is a protective film protecting the source electrode 13, the drain electrode 14, and the gate electrode 15. Openings 12a and 12b are provided in the insulating film 12. The opening 12a exposes a part of the source electrode 13, and the opening 12b exposes a part of the drain electrode 14. In addition, an opening 21a is provided at a place corresponding to the gate electrode 15 in the insulating film 21. The gate electrode 15 comes into contact with the semiconductor stack 11 via this opening 21a. The insulating film 21 is a silicon nitride (SiN) film formed by a low pressure CVD method, and the insulating film 12 is a SiN film formed by a plasma CVD method.

Each of the source electrode 13 and the drain electrode 14 comes into contact with the barrier layer of the semiconductor stack 11. The source electrode 13 and the drain electrode 14 are ohmic electrodes including aluminum (Al). The source electrode 13 and the drain electrode 14 are realized by alloying a layered structure of a tantalum (Ta) layer, an Al layer, and a Ta layer at a temperature within a range of 500° C. to 800° C., for example. In addition, a titanium (Ti) layer can be employed in place of a Ta layer. Furthermore, a gold (Au) layer may be formed on the foregoing layered structure. A part of surfaces of the source electrode 13 and the drain electrode 14 is covered with the insulating film 12.

The gate electrode 15 is provided between the source electrode 13 and the drain electrode 14. For example, the gate electrode 15 includes a metal which comes into Schottky-contact with the cap layer of the semiconductor stack 11 and has a layered structure of a nickel (Ni) layer and a gold (Au) layer, for example. In this case, the Ni layer comes into Schottky-contact with the cap layer.

The conductive barrier layer 16 is a conductive layer protecting the source electrode 13 and is provided inside the opening 12a. The conductive barrier layer 16 has a Ti layer, a TiWN layer, and a TiW layer which are laminated on top of one another, for example. In addition, the conductive barrier layer 17 is a conductive layer protecting the drain electrode 14 and is provided inside the opening 12b. The configurations of the conductive barrier layers 16 and 17 are the same as each other.

Next, with reference to FIGS. 2A to 5C, the method for manufacturing a part of a semiconductor device according to the present embodiment will be described. FIGS. 2A to 2C, 3A to 3C, 4A, 4B, and 5A to 5C are diagrams for explaining the method for manufacturing a part of the semiconductor device 1 according to the present embodiment. Hereinafter, the method for manufacturing the source electrode 13 which is an ohmic electrode included in the semiconductor device 1 and the conductive barrier layer 16 which is provided on the source electrode 13 will be described in detail.

Figure 2A:
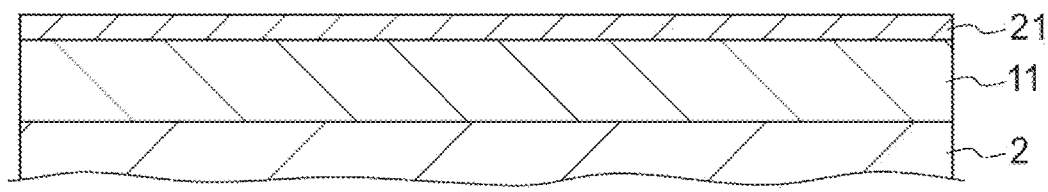
FIGS. 2A to 2C are diagrams for explaining the method for manufacturing a part of the semiconductor device according to the embodiment.

First, as illustrated in FIG. 2A, the insulating film 21 is formed above the substrate 2. First, the semiconductor stack 11 is grown on the substrate 2 by metal organic chemical vapor deposition (MOCVD). Subsequently, the insulating film 21 is formed on the semiconductor stack 11. The insulating film 21 is a SiN film formed by a low pressure chemical vapor deposition (LPCVD) method, for example. The LPCVD method is a method of forming a dense film by decreasing a deposition pressure and increasing a deposition temperature. The thickness of the insulating film 21 is within a range of 10 nm to 30 nm, for example. The deposition temperature of the insulating film 21 is within a range of 800° C. to 900° C., for example, and the deposition pressure thereof is within a range of 10 Pa to 100 Pa, for example.

Figure 2B:
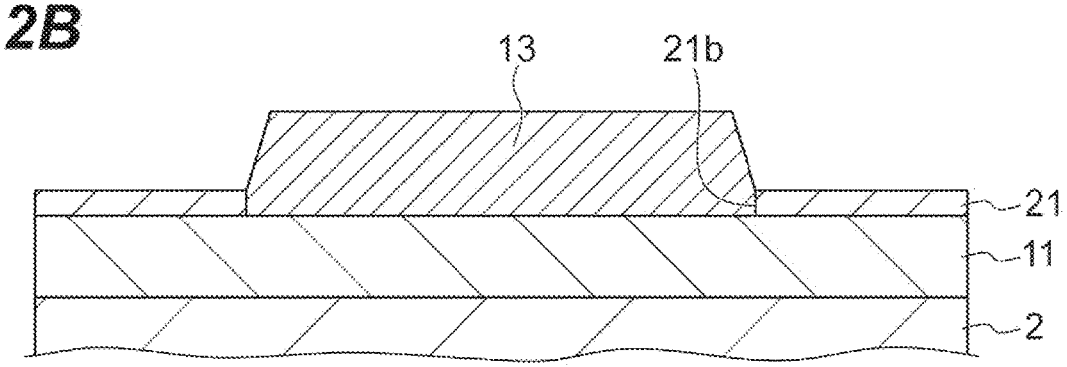

Next, as illustrated in FIG. 2B, the source electrode 13 which is an ohmic electrode including Al is formed on the substrate 2. First, an opening 21b is formed in the insulating film 21. Subsequently, a source metal having a Ta layer, an Al layer, and a Ta layer which are layered in order is deposited inside the opening 21b. The thickness of the Ta layer on the lower side is within a range of 5 nm to 10 nm, for example. The thickness of the Al layer is within a range of 200 nm to 400 nm, for example. The thickness of the Ta layer on the upper side is within a range of 5 nm to 10 nm, for example. Subsequently, the source metal is alloyed by heating the source metal to a temperature within a range of 500° C. to 800° C., and then the source electrode 13 is formed. The drain electrode 14 (refer to FIG. 1) is also formed when forming the source electrode 13 (not illustrated). A source metal is formed through an evaporation method and lift-off using a resist pattern (not illustrated), for example. This resist pattern may also be used for forming the opening 21b.

Figure 2C:
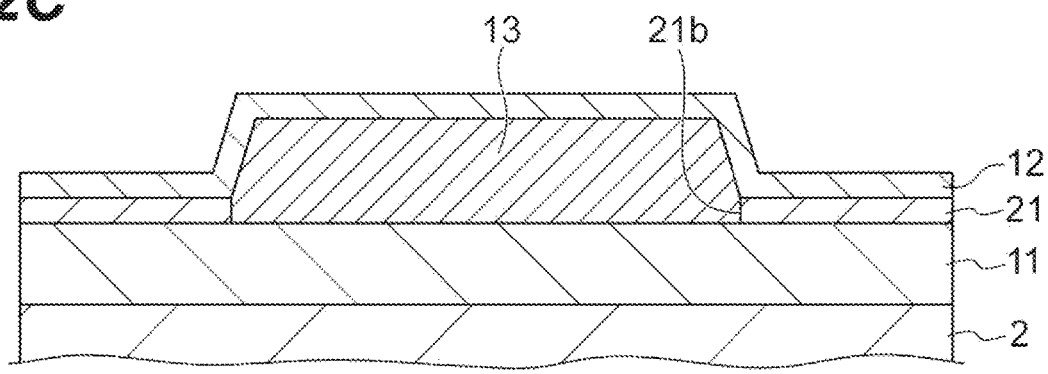

Next, as illustrated in FIG. 2C, the insulating film 12 covering the insulating film 21 and the source electrode 13 is formed. In the present embodiment, the insulating film 12 is a SiN film formed by a plasma CVD method. The deposition temperature of the insulating film 12 is within a range of 300° C. to 320° C., for example. The thickness of the insulating film 12 is within a range of 30 nm to 50 nm, for example.

Figure 3A:
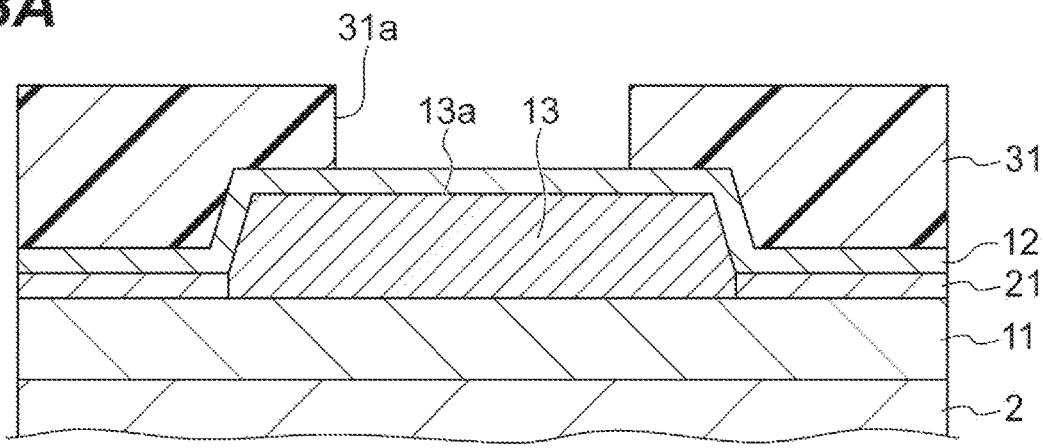
FIGS. 3A to 3C are diagrams for explaining the method for manufacturing a part of the semiconductor device according to the embodiment.

Next, as illustrated in FIG. 3A, a first photoresist 31 having an opening pattern 31a overlapping the source electrode 13 is formed on the insulating film 12. First, the insulating film 12 is coated with the first photoresist 31. Subsequently, lithography is performed with respect to the first photoresist 31, and then the opening pattern 31a is formed in the first photoresist 31. The opening pattern 31a is provided at a position overlapping the source electrode 13 in the first photoresist 31. A part of the insulating film 12 is exposed within the opening pattern 31a. The first photoresist 31 is an ultraviolet resist, for example. The thickness of the first photoresist 31 is within a range of 1 μm to 2 μm, for example.

Figure 3B:
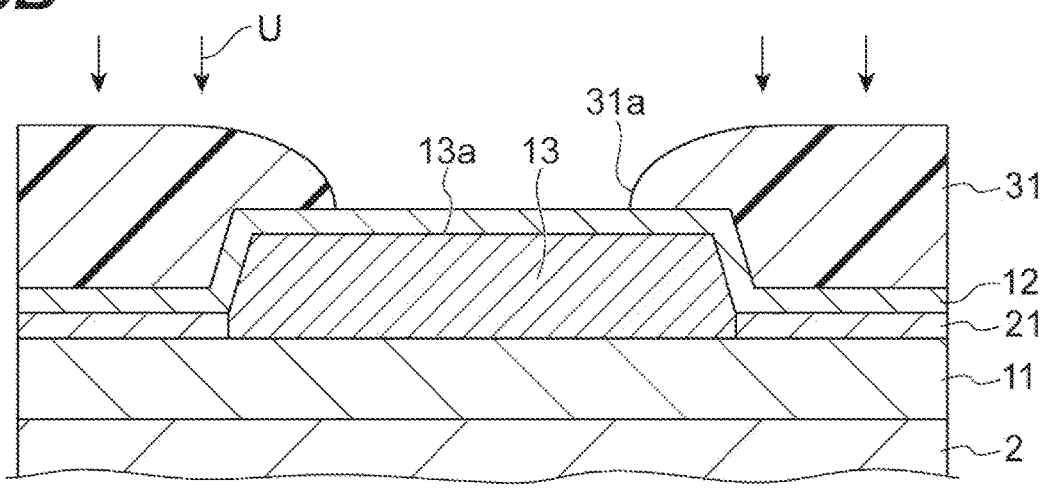

Next, the first photoresist 31 is subjected to a heat treatment. For example, the first photoresist 31 is heated to (baked at) 120° C. or higher. The fluidity of the first photoresist 31 increases due to this baking. Accordingly, as illustrated in FIG. 3B, an end portion of the first photoresist 31 forming the opening pattern 31a loses its edge. Due to a surface tension of the first photoresist 31, the first photoresist 31 is inhibited from flowing to an upper portion of the source electrode 13. Subsequently, the first photoresist 31 is subjected to ultraviolet curing. In this step, the first photoresist 31 is irradiated with ultraviolet rays U. Accordingly, the first photoresist 31 is cured, so that expansion or the like is unlikely to occur in the first photoresist 31. In addition, a shape change is unlikely to occur in the opening pattern 31a as well. The ultraviolet rays U are ultraviolet rays obtained from a mercury lamp having a wavelength of approximately 365 nm, for example.

Figure 3C:
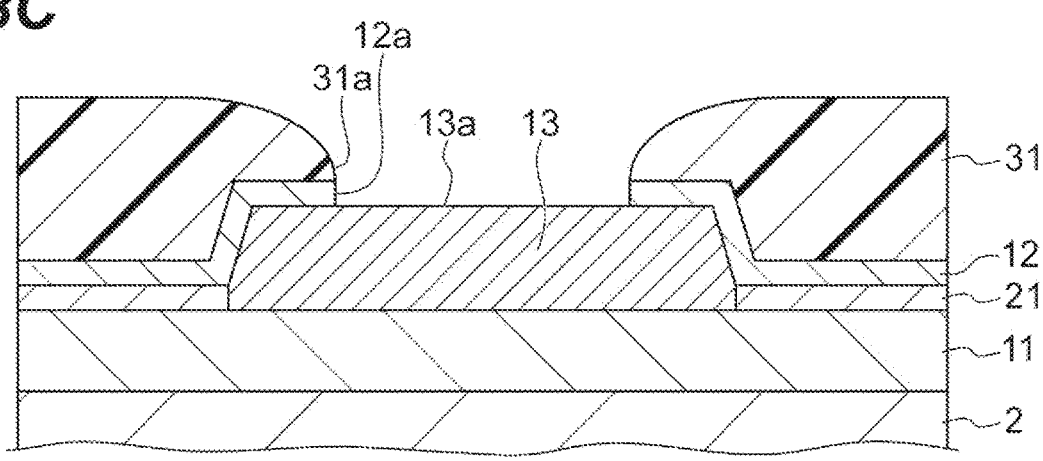

Next, a portion of the insulating film 12, which is exposed from the first photoresist 31, is subjected to dry etching using a fluorine-containing gas. Accordingly, as illustrated in FIG. 3C, a part of a surface of the source electrode 13 is exposed inside the opening 12a. Specifically, a portion of a top surface 13a of the source electrode 13 overlapping the opening 12a is exposed. The dry etching is reactive ion etching (RIE), for example. As a fluorine-containing gas, at least one is selected from the group consisting of $SF_6$, $CF_4$, $CHF_3$, $C_3F_6$, and $C_2F_6$, for example. An inductive coupled plasma (ICP)-type RIE device may be adopted.

Figure 4A:
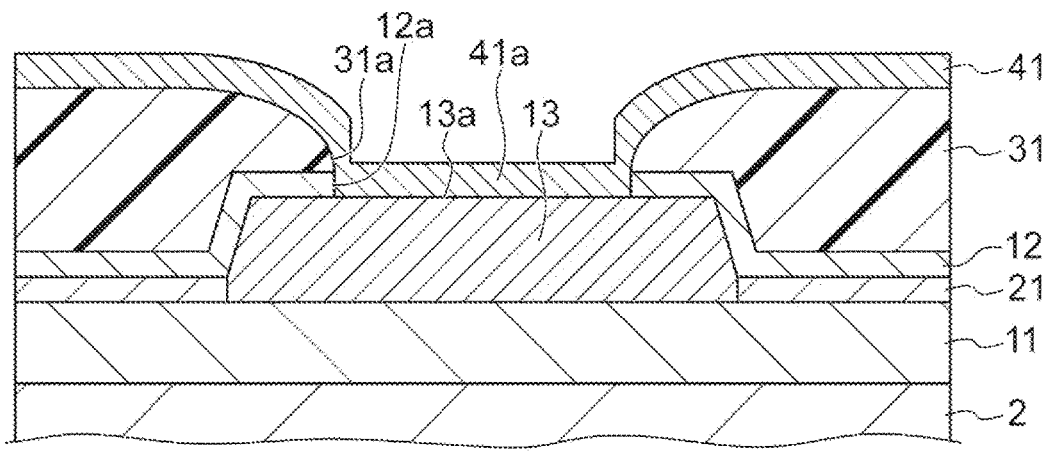
FIGS. 4A and 4B are diagrams for explaining the method for manufacturing a part of the semiconductor device according to the embodiment.

Next, as illustrated in FIG. 4A, a barrier metal layer 41 is formed on the first photoresist 31 and on the source electrode 13 exposed through the opening 12a of the insulating film 12. For example, the barrier metal layer 41 having a Ti layer, a TiWN layer, and a TiW layer which are layered each other is formed by a sputtering method. A part of the barrier metal layer 41 comes into contact with the source electrode 13 inside the opening 12a. The thickness of the Ti layer is 5 nm, for example. The thickness of the TiWN layer is 300 nm, for example. The thickness of the TiW layer is 6 nm, for example. The thickness of the barrier metal layer 41 when being deposited on a flat surface is equivalent to approximately the sum of the thicknesses of the layers described above. However, for example, in the barrier metal layer 41, the thickness of a portion deposited in a side wall of the first photoresist 31 or a side wall of the opening 12a of the insulating film 12 becomes smaller than the foregoing thickness. In the present embodiment, in the barrier metal layer 41, the thickness at a place positioned on the side wall of the first photoresist 31 is 100 nm or smaller.

Figure 4B:
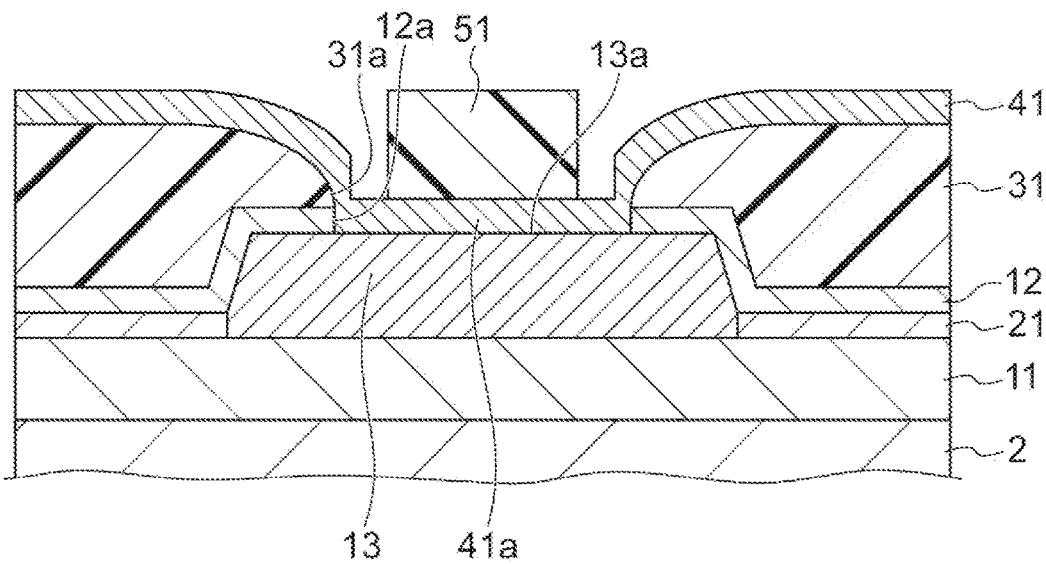

Next, as illustrated in FIG. 4B, a second photoresist 51 is formed inside the opening pattern 31a of the first photoresist 31. The second photoresist 51 is formed on a portion 41a of the barrier metal layer 41 overlapping the opening 12a. As illustrated in FIG. 4B, a part of the portion 41a of the barrier metal layer 41, which is located on the source electrode 13, may be exposed from the second photoresist 51. Similar to the first photoresist 31, the second photoresist 51 is an ultraviolet resist, for example. The thickness of the second photoresist 51 is within a range of 1 μm to 2 μm, for example.

Figure 5A:
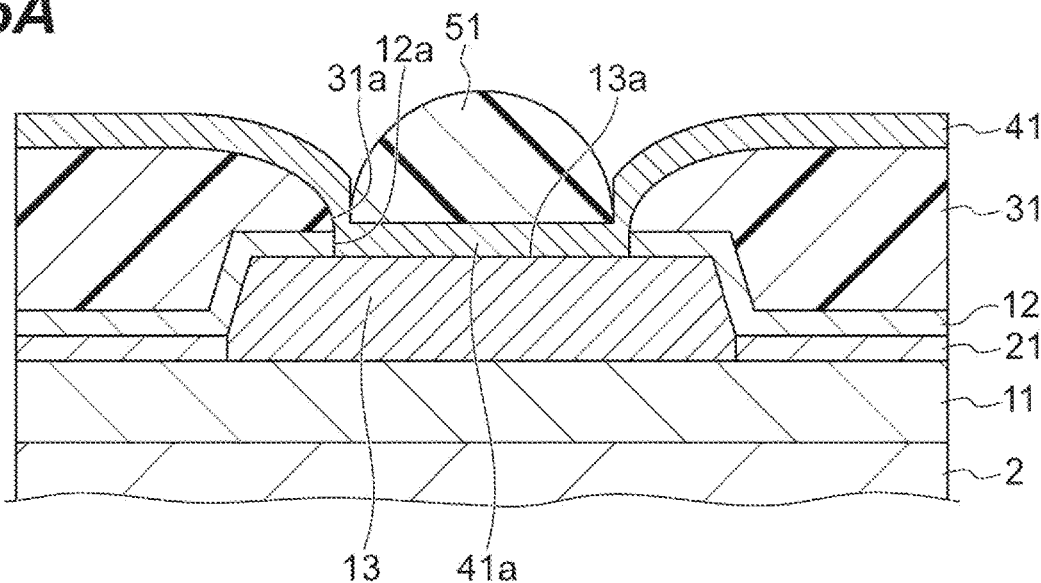
FIGS. 5A to 5C are diagrams for explaining the method for manufacturing a part of the semiconductor device according to the embodiment.

Next, as illustrated in FIG. 5A, the second photoresist 51 is subjected to a heat treatment, and the barrier metal layer 41 overlapping the opening 12a of the insulating film 12 is covered with the second photoresist 51. For example, the second photoresist 51 is heated to (baked at) 140° C. or higher. From the viewpoint of covering the portion 41a of the barrier metal layer 41 overlapping the source electrode 13 with the second photoresist 51, the baking temperature may be higher than the baking temperature of the first photoresist 31. Accordingly, the second photoresist 51 flows, and the portion 41a of the barrier metal layer 41 is covered with the second photoresist 51. On the other hand, the first photoresist 31 does not flow or does not substantially flow. Furthermore, expansion or the like is unlikely to occur or does not substantially occur in the first photoresist 31. This is because the first photoresist 31 has already been baked and cured by the ultraviolet rays U.

Figure 5B:
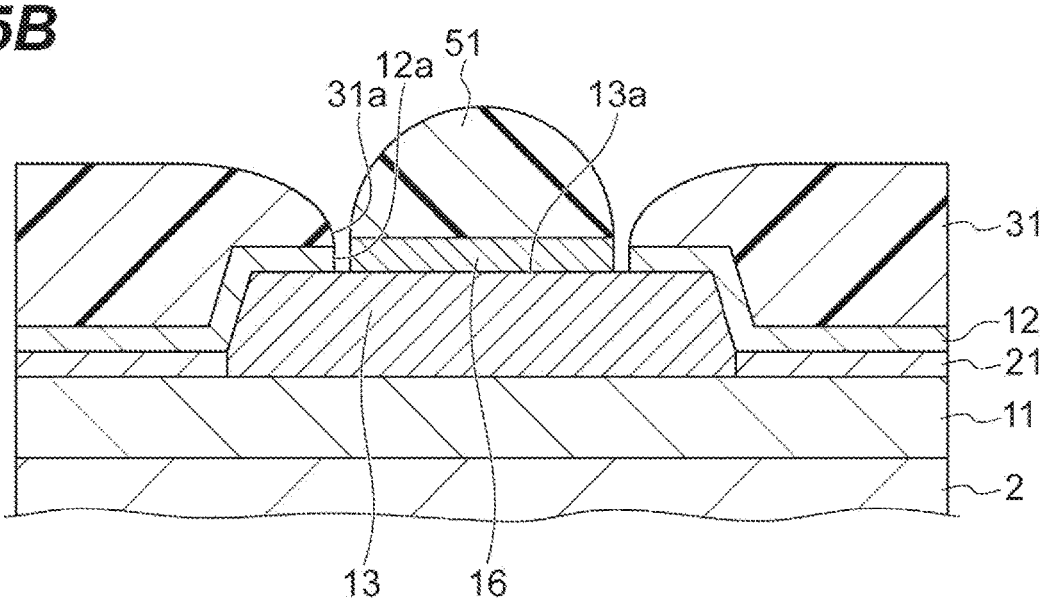

Next, as illustrated in FIG. 5B, the barrier metal layer 41 is etched using the second photoresist 51. A portion of the barrier metal layer 41 exposed from the second photoresist 51 is subjected to dry etching using a fluorine-containing gas. Accordingly, the conductive barrier layer 16 which covers the top surface 13a of the source electrode 13 and covers the source electrode 13 exposed through the opening 12a of the insulating film 12 is formed. In this case, a part in the portion 41a of the barrier metal layer 41 on the source electrode 13, which is located between an end of the second photoresist 51 and an edge of the opening 12a of the insulating film 12, is removed, and thus a part of the surface of the source electrode 13 is exposed. The exposed surface has a width approximately equivalent to the thickness of the barrier metal layer 41. Since the thickness of a portion of the barrier metal layer 41 positioned at the side wall portion of the first photoresist 31 is 100 nm or smaller, the width of a gap where this source electrode 13 is exposed is limited to 100 nm or smaller.

Figure 5C:
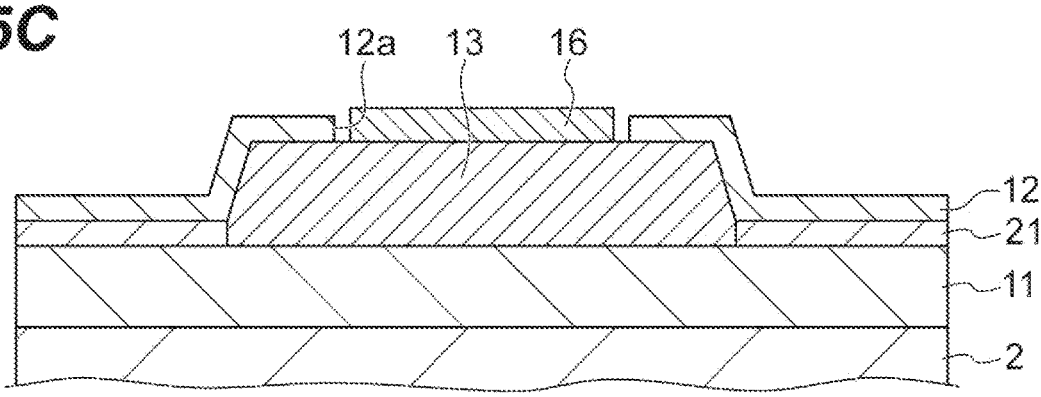

Next, as illustrated in FIG. 5C, the first photoresist 31 and the second photoresist 51 are removed. When a part of the barrier metal layer 41 remains on the first photoresist 31, the part can be removed together with the first photoresist 31 through lift-off. The source electrode 13 and the conductive barrier layer 16 are formed by performing the steps described above.

The semiconductor device 1 according to the present embodiment is formed through the foregoing steps. After the semiconductor device 1 is formed, an interlayer insulating film for covering the semiconductor device 1 may be formed, a via hole penetrating the interlayer insulating film and causing a conductive barrier layer to be exposed may be formed, and a Au wiring layer to be embedded into the via hole may be formed.

According to the method for manufacturing the semiconductor device 1 of the present embodiment described above, by performing the foregoing steps, the portion 41a of the barrier metal layer 41 overlapping the opening 12a can be covered with the second photoresist 51 which has flown. Then, when the barrier metal layer 41 exposed from the second photoresist 51 is removed, it is possible to not only cover the top surface 13a of the source electrode 13 which is an ohmic electrode including Al but also to minimize the gap between the insulating film 12 and the conductive barrier layer 16 to being within an extremely small width. Accordingly, even when a heat treatment is performed thereafter during a process of manufacturing the semiconductor device 1, or when stress is generated with respect to the source electrode 13 by forming an interlayer insulating film for covering the semiconductor device 1, it is possible to prevent a hillock generated due to Al included in the source electrode 13.

Generally, when baking is performed with respect to a photoresist covered with a metal layer, the photoresist expands and bursts through the metal layer. However, in the present embodiment, the first photoresist 31 is baked first and is cured by the ultraviolet rays U before the second photoresist 51 is subjected to second baking. Therefore, expansion does not occur or does not substantially occur in the first photoresist 31 during the second baking. This applies to a case in which the second baking temperature is higher than a first baking temperature.

The method for manufacturing the semiconductor device 1 according to the present embodiment includes a step of performing a heat treatment on the first photoresist 31 before performing ultraviolet curing of the first photoresist 31. In this case, corners of the first photoresist 31 are rounded. Therefore, when the barrier metal layer 41 is formed as illustrated in FIG. 4A, side surfaces of the first photoresist 31 and the insulating film 12 can be reliably covered. When the barrier metal layer 41 is etched as illustrated in FIG. 5A in a state in which the side surfaces are not covered, the width of the gap exposing the surface of the source electrode 13 therethrough is enlarged.

In the present embodiment, the barrier metal layer 41 has a Ti layer, a TiWN layer, and a TiW layer which are laminated on top of one another. In this case, the conductive barrier layers 16 and 17 exhibit favorable barrier performance.

The method for manufacturing a semiconductor device according to the present disclosure is not limited to the embodiment described above, and various changes can be made thereto. For example, the embodiment has been described regarding an example in which the present disclosure is applied to an HEMT. However, the manufacturing method of the present disclosure can be applied to various field effect transistors other than an HEMT.

What is claimed is:

1. A semiconductor device comprising:
a semiconductor substrate;
a semiconductor stack on a semiconductor substrate;
an ohmic electrode including Al on the semiconductor stack;
a SiN film covering the ohmic electrode;
an opening in the SiN film;
a barrier metal layer formed inside the opening; and
a gap between an edge of the opening and an end of barrier metal layer,
wherein a width of the gap is smaller than a thickness of the barrier metal layer.

2. The semiconductor device according to claim 1, wherein the barrier metal layer includes a Ti layer, a TiWN layer, and a TiW layer which are layered in order.

3. The semiconductor device according to claim 1, wherein a thickness of the SiN film is within a range of 30 nm to 50 nm.

4. The semiconductor device according to claim 1, wherein the width of the gap is 100 nm or smaller.

* * * * *